United States Patent [19]

Kawase et al.

[11] 4,382,776

[45] May 10, 1983

[54] QUARTZ TUBE FOR THERMAL PROCESSING OF SEMICONDUCTOR SUBSTRATES

[75] Inventors: Nobuo Kawase, Sagamihara; Masayoshi Aigo, Kawasaki, both of Japan

[73] Assignee: Fujitsu Limited, Kawasaki, Japan

[21] Appl. No.: 290,975

[22] Filed: Aug. 7, 1981

[30] Foreign Application Priority Data

Aug. 18, 1980 [JP] Japan .............................. 55/113149

[51] Int. Cl.³ .......................... F27D 3/00; F27D 5/00
[52] U.S. Cl. ........................................ 432/9; 432/10; 432/253; 432/258
[58] Field of Search .................... 432/9, 10, 11, 253, 432/258; 285/284, 286, 292, 293

[56] References Cited

U.S. PATENT DOCUMENTS 3,604,694  9/1971  Mueller .............................. 432/253
4,278,422  7/1981  Thompson .......................... 432/253

*Primary Examiner*—John J. Camby
*Attorney, Agent, or Firm*—Staas & Halsey

[57] ABSTRACT

A quartz tube adapted for thermal processing of semiconductor substrates comprising a double-layered central tube having an external sintered crystalline quartz layer fused with a quartz layer of different quality, i.e. an internal transparent fused quartz layer. Both ends of the central tube are fused with the ends of two transparent fused quartz end tubes. The double-layered tube portion can be produced by compacting quartz particulates by means of centrifugal force within a mould and heating from the center with or without placing a fused quartz tube on its inner surface. Semiconductor substrates are processed using this quartz tube, thereby semiconductor devices having stabilized high qualities are produced at an increased yield as well as at a low cost.

5 Claims, 3 Drawing Figures

QUARTZ TUBE FOR THERMAL PROCESSING OF SEMICONDUCTOR SUBSTRATES

BACKGROUND OF THE INVENTION

1. Field of the Invention

This invention relates to an improved quartz tube adapted for thermal processing of semiconductor substrates, and more particularly to a quartz tube comprising a double-layered central tube.

2. The Prior Art

Semiconductor substrates are subjected to high-temperature processing, such as oxidation, evaporation, chemical vapor deposition, diffusion of impurities etc. Transparent fused quartz tubes have been conventionally used in these types of processing, because they are not porous and can be produced from highly pure silica and are not easily contaminated with undesired impurities.

However, fused quartz tubes have a disadvantage in that they can not be produced perfectly symmetrical with the outer diameter maintained at a desired length. Therefore, it is necessary to make a relatively large allowance for the gap between the outer surface of the tube and the furnace, which leads to lowering its thermal efficiency. In addition, the unevenness on the surface of the tube results in a so-called lens effect when ultra-red rays irradiate, i.e., an extraordinarily high temperature appears in a spot within the processing tube and, consequently, undesired reactions occur in the processing of semiconductor substrates. Furthermore, the thickness of the wall of a fused quartz tube is usually limited to from about 3 to about 4 mm, which lowers its thermal capacitance. Then, a liner tube must be provided in the gap between the processing tube and the heater, so as to ensure uniform heating of the tube. Such a tube increases the bulk of the processing apparatus as a whole and, consequently, consumption of power necessary for heating is increased.

The fused quartz tube has another disadvantage, i.e., it deforms at a temperature above 1200° C. On the other hand, thermal processing of semiconductor substrates is often carried out at a temperature of from 1150° to 1300° C. Thus, a fused quartz tube suffers from inevitable deformation during thermal processing. Therefore, quartz susceptors in the tube deform and also semiconductor substrates loaded on them deform and even crack. In addition, the deformed quartz tube suffers from wear due to friction with the quartz susceptors. When they are inserted into the tube and removed from the tube, fine powder of quartz is produced by the friction and contaminates the surface of the substrates. Such a tube must be replaced before unacceptable deformation occurs. Thus, a fused quartz tube has a short service life.

Japanese Patent Application Laid-open No. 51-79581 discloses a fused quartz tube, the central portion of which has a thickness greater than the end portions of the tube. However, this quartz tube still has a tendency to easily deform.

SUMMARY OF THE INVENTION

It is an object of this invention to provide a non-porous, thermally resistive, uniformly thermoconductive, accurately sized and highly pure quartz tube adapted for processing of semiconductor substrates.

It is another object of this invention to provide a method for producing such a quartz tube adapted for thermal processing of semiconductor substrates.

It is still another object of this invention to provide a method for thermal processing of semiconductor substrates to produce semiconductor devices with stabilized high qualities at an improved yield and at a low cost.

Other objects and advantages of this invention will further become apparent from the following description.

According to this invention, there is provided a quartz tube adapted for thermal processing of semiconductor substrates, comprising a double-layered central tube having an external sintered crystalline quartz layer fused with an internal layer having different qualities, i.e., a conventional transparent fused quartz layer, both ends of said central tube being fused with the ends of two transparent fused quartz end tubes, which ends have substantially the same inner diameter as that of said double-layered central tube.

According to another aspect of this invention, there is provided a method for producing a quartz tube adapted for thermal processing of semiconductor substrates, wherein said method comprises the steps:

(a) depositing finely divided crystalline quartz particulates on the inner surface of a cylindrical mould, while said cylindrical mould rotates around its longitudinal axis;

(b) heating said deposited crystalline quartz particulate layer, with a heater located in the longitudinal axis of said cylindrical mould, so as to sinter said crystalline quartz particulates as a whole, and fuse said crystalline quartz particulates with each other on and near the surface of said deposited layer, thus forming a double-layered tube having an internal transparent fused quartz layer fused with an external sintered crystalline quartz layer;

(c) forming a tapered area on the outer surface of both ends of said double-layered tube; and, (d) fusing said tapered ends of said double-layered tube with the ends of two transparent fused quartz end tubes, which ends have substantially the same inner diameter as that of said double-layered central tube.

According to still another aspect of this invention, there is provided a method for producing a quartz tube adapted for thermal processing of semiconductor substrates, wherein said method comprises the steps:

(a) filling finely divided crystalline quartz particulates in the gap between a cylindrical mould and a transparent fused quartz tube located coaxially with said mould within said mould;

(b) heating said crystalline quartz particulates through said transparent fused quartz tube, with a heater located coaxially with said tube within said tube, whereas said mould rotates quickly around its longitudinal axis, so as to sinter said crystalline quartz particulates as a whole and fuse them with said internal transparent fused quartz tube, thus forming a double-layered tube having an internal transparent fused quartz layer fused with an external sintered crystalline quartz layer;

(c) forming a tapered area on the outer surface of both ends of said double-layered tube; and, (d) fusing said tapered ends of said double-layered tube with the ends of two transparent fused quartz end tubes, which ends have substantially the same inner diameter as that of said double-layered central tube.

According to yet another aspect of this invention, there is provided a method for thermal processing of semiconductor substrates, comprising the step of heating said substrates in a quartz tube with a double-layered central tube having a conventional internal transparent fused quartz layer fused with a layer having different qualities an external sintered crystalline quartz layer, both ends of said central tube being fused with the ends of two transparent fused quartz end tubes which ends have substantially the same inner diameter as that of said double-layered central tube.

BRIEF DESCRIPTION OF THE DRAWINGS

This invention will now be illustrated in detail by referring to the attached drawings.

DETAILED DESCRIPTION OF THE PREFERRED EMBODIMENTS

Figure 1:
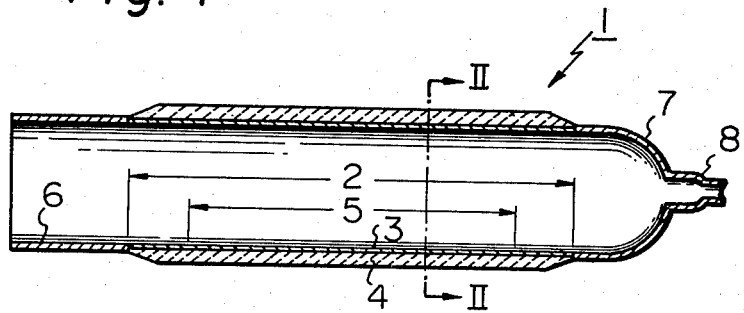
FIG. 1 is a sectional side view of one embodiment of a quartz tube of this invention.
Figure 2:
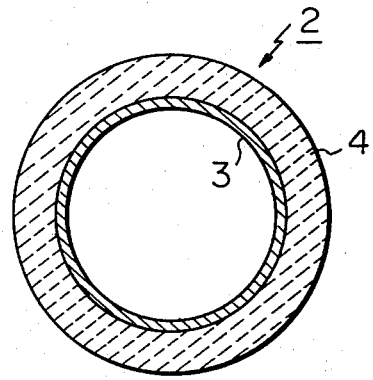
FIG. 2 is a cross view taken along the lines II—II of FIG. 1.

As shown in FIGS. 1 and 2, the quartz tube 1 has a double-layered central tube portion 2. This central tube 2 consists of an opaque, porous external sintered crystalline quartz layer 4 fused with a substantially coextensive and coterminous, non-porous internal transparent fused quartz layer 3. The quartz tube 1 is inserted through a furnace, the length of the inserted region 5 is shorter than the length of the double-layered tube portion 2, so as to heat uniformly the reaction zone within the tube 1. Both ends of the double-layered tube 2 are fused with the ends of the two end tubes 6, 7, respectively. The end tube 7 has a tail tube 8. The fused ends of these end tubes 6, 7 have substantially the same inner diameter as that of the central tube 2, and they are made from transparent fused quartz.

Figure 3:
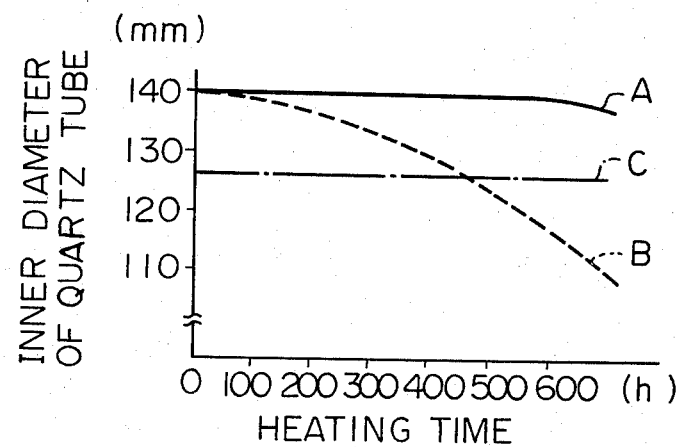
FIG. 3 is a diagram showing the relation between heating time and inner diameter of quartz tubes.

Generally, transparent quartz and crystalline quartz differ from each other not only in atomic arrangement but also in resistivity against thermal treatment. Fused quartz deforms at about 1200° C., whereas sintered crystalline quartz deforms at a temperature above 1700° C. When a quartz tube is heated, it becomes gradually flattened and its diameter decreases in one direction. When its original inner diameter is 140 mm, the acceptable inner diameter is considered to be not shorter than 127 mm. For example, as seen in FIG. 3 the quartz tube A of this invention has a double-layered central tube 2 which consists of an external sintered crystalline quartz layer 6 mm in thickness and an internal transparent fused quartz layer 2 mm in thickness. The tube A begins to deform after about 600 hours of thermal processing, however, the decreased diameter does not yet reach the critical value C. Contrary to this, a prior art tube B has only one layer of transparent fused quartz from 3 to 4 mm in thickness, and exhibits a shorter service life, i.e., its inner diameter decreases more under the critical value C even after 450 hours.

Furthermore, the tube A of this invention has naturally a larger thermal capacitance than the prior art tube B, therefore it is possible to ensure a uniform heating in the processing zone of the tube without providing a liner tube outside the processing tube.

The double-layered central tube 2 is made according to the method of this invention. Finely divided crystalline quartz particulates from about 150 mesh to about 250 mesh are charged on the inner surface of a cylindrical mould, which is rotating at a high speed. Thus, the quartz particulates are pressed on its surface and heated from the center of the cylindrical mould. The quartz particulates are fused on and near the inner surface of its deposited layer and forms a fused quartz layer 3. The rest of the quartz particulates are sintered and form a crystalline quartz layer 4, the density of which increases transiently from the fused layer 3. The outer surface of the sintered layer 4 is defined by the inner surface of the mould, therefore its outer surface size, shape and evenness is accurately formed. The fused quartz layer 3 may be formed at least 2 mm in thickness. If the layer is too thin, pin holes or pits appear and the surface wears off easily due to friction with the susceptors and a cleaning chemical solution etches the layer 3 and penetrates up to the porous sintered crystalline quartz layer 4.

The double-layered central tube 2 can be formed also as follows.

A fused quartz tube is inserted within a cylindrical mould. Finely divided crystalline quartz particulates are filled in the gap between the tube and the mould. Then, the particulates are compacted, while rotating at a high speed, and heated from the center of the cylindrical mould through the fused quartz tube and sintered to each other and to the inserted tube. This double-layered tube can be formed with a fused quartz layer 3 of any desired thickness, e.g., from 3 to 5 mm. Therefore, the above-mentioned defects of the internal fused quartz layer 3 due to its thinness can be eliminated.

Both ends of the outer surface of the double-layered tube are tapered, so that the flame of the burner can extend into the desired depth of the layer. The ends are also fused with end tubes 6 and 7, respectively. The end tube 6 is an inlet for susceptors loaded with substrates. The end tube 7 is an inlet for reactive gas and is provided with a tail tube 8.

The thus formed quartz tube 1 is inserted through a furnace. Susceptors of highly pure guartz loaded with a plurality of semiconductor substrates are introduced through the end tube 6 into the region 5. Heaters of the furnace not shown facing the external sintered crystalline quartz layer 4 heat the region 5 to a desired temperature. For example, the substrates located in the region 5 are heated, in the case of oxidation of silicon wafers at a temperature of from 900° to 1200° C. and in the case of diffusion of impurities, such as phosphorus, boron or antimony, at a temperature of from 1100° to 1250° C.

Thus, the quartz tube according to this invention has a double-layered central tube portion, which is formed with relative accuracy in size and shape. In addition, the major thickness of its wall is occupied by an opaque sintered crystalline quartz layer, which has a high deformation temperature. An abnormally high temperature spot does not appear in the reaction zone and the occurrence of an abnormal functional layer in the semiconductor substrates can be eliminated. In addition, the inner fused quartz layer has a non-porous and even surface. Quartz powder is not produced due to friction at the time of introducing and removing of the substrate susceptors. The produced substrates exhibit a stabilized high quality without being contaminated by quartz powder. Furthermore, the quartz tube according to this invention contributes to the automatic processing of the substrates, and to increasing their production yield as well as lowering the production cost.

We claim:

1. A quartz tube adapted for thermal processing of semiconductor substrates, comprising: a double-layered central tube having an external sintered crystalline quartz layer fused with an internal transparent fused quartz layer, wherein both ends of said central tube are fused with the ends of two transparent fused quartz end tubes, which ends of the fused quartz end tubes have substantially the same inner diameter as that of said double-layered central tube.

2. The tube of claim 1, wherein the length of the external layer is substantially equal in length to the length of the internal layer.

3. A method for the thermal processing of semiconductor substrates, comprising the step of: heating said substrates in a quartz tube having a double-layered central tube with an internal transparent fused quartz layer fused with an external sintered crystalline quartz layer, wherein both ends of said central tube are fused with the ends of two transparent fused quartz end tubes, which ends of the fused quartz end tubes have substantially the same inner diameter as that of said double-layered central tube.

4. The method of claim 3, wherein the heating step occurs at greater than 1200° C.

5. The method of claim 3, wherein the length of the external layer is substantially equal in length to the length of the internal layer.

* * * * *

UNITED STATES PATENT AND TRADEMARK OFFICE
CERTIFICATE OF CORRECTION

PATENT NO. : 4,382,776
DATED : 5/10/83
INVENTOR(S) : Nobuo Kawase; Masayoshi Aigo It is certified that error appears in the above-identified patent and that said Letters Patent is hereby corrected as shown below:

Front page, (56) References Cited, "Mueller" should be --Muller--.

Col. 3, line 7, after "qualities" insert --, i.e.,--;
line 18, "cross" should be --cross-sectional--.

Col. 4, line 40, "guartz" should be --quartz--.

Signed and Sealed this

Seventh Day of February 1984

[SEAL]

Attest:

GERALD J. MOSSINGHOFF

Attesting Officer

Commissioner of Patents and Trademarks